US011114371B2

(12) United States Patent
Kim et al.

(10) Patent No.: US 11,114,371 B2
(45) Date of Patent: Sep. 7, 2021

(54) SUBSTRATE-ON-SUBSTRATE STRUCTURE AND ELECTRONIC DEVICE COMPRISING THE SAME (71) Applicant: SAMSUNG ELECTRO-MECHANICS CO., LTD., Suwon-si (KR)

(72) Inventors: Yong Hoon Kim, Suwon-si (KR); Seung Eun Lee, Suwon-si (KR); Young Kwan Lee, Suwon-si (KR); Hak Chun Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/800,201

(22) Filed: Feb. 25, 2020

(65) Prior Publication Data
US 2021/0183754 A1 Jun. 17, 2021

(30) Foreign Application Priority Data

Dec. 11, 2019 (KR) .......................... 10-2019-0164685

(51) Int. Cl.
H01L 23/498 (2006.01)
H01L 23/00 (2006.01)
H01L 25/16 (2006.01)
H05K 1/18 (2006.01)

(52) U.S. Cl.
CPC .. *H01L 23/49833* (2013.01); *H01L 23/49816* (2013.01); *H01L 23/49822* (2013.01); *H01L 23/49838* (2013.01); *H01L 23/562* (2013.01); *H01L 24/16* (2013.01); *H01L 25/16* (2013.01); *H05K 1/18* (2013.01);

(Continued)

(58) Field of Classification Search
CPC ......... H01L 23/49833; H01L 23/49816; H01L 23/49822; H01L 23/49838; H01L 23/562; H01L 24/16; H01L 25/16; H01L 2224/16227; H01L 2224/16237; H01L 2924/19102; H05K 1/115; H05K 1/18
See application file for complete search history.

(56) References Cited

U.S. PATENT DOCUMENTS 7,053,493 B2    5/2006 Kanda et al.
8,952,511 B2    2/2015 Sathe et al.
10,886,147 B1*  1/2021 Huang .................... H01L 24/10
(Continued)

*Primary Examiner* — Douglas W Owens (74) *Attorney, Agent, or Firm* — Morgan, Lewis & Bockius LLP (57) ABSTRACT A substrate-on-substrate structure and an electronic device including the same are provided. The substrate-on-substrate structure includes: a first printed circuit board having a first side and a second side; a second printed circuit board disposed on the second side of the first printed circuit board, and having a first side connected to the second side of the first printed circuit board and a second side opposite to the first side connected to the second side of the first printed circuit board; a reinforcing structure attached to the first side of the second printed circuit board, and spaced apart from the second side of the first printed circuit board; and an underfill resin disposed between the second side of the first printed circuit board and the first side of the second printed circuit board, and covering at least a portion of the reinforcing structure.

18 Claims, 5 Drawing Sheets (52) U.S. Cl.
 CPC ............... *H01L 2224/16227* (2013.01); *H01L 2224/16237* (2013.01); *H01L 2924/19102* (2013.01)

(56) References Cited

U.S. PATENT DOCUMENTS

| | | | | |
|---|---|---|---|---|
| 2012/0020040 | A1* | 1/2012 | Lin | H01L 25/16 361/772 |
| 2014/0042607 | A1* | 2/2014 | Knickerbocker | H01L 25/50 257/685 |
| 2014/0374902 | A1* | 12/2014 | Lee | H01L 25/105 257/738 |
| 2017/0117200 | A1* | 4/2017 | Kim | H01L 23/562 |
| 2018/0102470 | A1* | 4/2018 | Das | H01L 23/5384 |
| 2019/0343017 | A1* | 11/2019 | Eid | H05K 7/20263 |
| 2020/0219789 | A1* | 7/2020 | Uppal | H01L 23/24 |

* cited by examiner

SUBSTRATE-ON-SUBSTRATE STRUCTURE AND ELECTRONIC DEVICE COMPRISING THE SAME

CROSS-REFERENCE TO RELATED APPLICATION(S)

This application claims benefit of priority to Korean Patent Application No. 10-2019-0164685 filed on Dec. 11, 2019 in the Korean Intellectual Property Office, the disclosure of which is incorporated herein by reference in its entirety.

TECHNICAL FIELD

The present inventive concept relates to a substrate-on-substrate structure, and an electronic device including the same.

BACKGROUND

According to the number of I/Os and integration, increased due to the high performance of electronic products, high degrees of layering and a large size of a substrate are required in a substrate. For example, increases in the size and number of layers of a flip chip ball grid array (FCBGA) substrate for high performance semiconductors are required, and thus, a problem may occur in that cost increases due to an increase in technical difficulty and a decrease in yield. Therefore, there is a need for a technique capable of reducing costs while maintaining semiconductor performance. In addition, according to high degrees of layering and a large size of a substrate, the warpage characteristics of a substrate have also emerged as important characteristics. Therefore, there is demand for a technique capable of improving warpage characteristics of a substrate.

SUMMARY

An aspect of the present inventive concept is to provide a substrate-on-substrate structure capable of coping with high degrees of layering and a large size of a substrate, and an electronic device including the same.

Another aspect of the present inventive concept is to provide a substrate-on-substrate structure capable of reducing costs, and an electronic device including the same.

Another aspect of the present inventive concept is to provide a substrate-on-substrate structure capable of easily improving warpage characteristics, and an electronic device including the same.

According to an aspect of the present disclosure, a printed circuit board is stacked on a printed circuit board to provide a substrate-on-substrate structure.

According to another aspect of the present disclosure, in the substrate-on-substrate structure, a reinforcing structure, spaced apart from a printed circuit board on a lower side, is attached to a lower surface of a printed circuit board on an upper side, and fixed by an underfill resin.

According to an aspect of the present inventive concept, a substrate-on-substrate structure includes: a first printed circuit board having a first side and a second side, opposite to the first side; a second printed circuit board disposed on the second side of the first printed circuit board, and having a first side connected to the second side of the first printed circuit board and a second side opposite to the first side connected to the second side of the first printed circuit board; a reinforcing structure attached to the first side of the second printed circuit board, and spaced apart from the second side of the first printed circuit board; and an underfill resin disposed between the second side of the first printed circuit board and the first side of the second printed circuit board, and covering at least a portion of the reinforcing structure.

For example, an electronic device includes: a mainboard; a first printed circuit board disposed on an upper side of the mainboard; a second printed circuit board disposed on an upper side of the first printed circuit board; an electronic component disposed on an upper side of the second printed circuit board; a reinforcing structure disposed between the first and second printed circuit boards, attached to a lower side of the second printed circuit board, and spaced apart from the first printed circuit board; and an underfill resin disposed between the first and second printed circuit boards, and covering at least a portion of the reinforcing structure.

For example, an electronic device includes: a first printed circuit board; first electrical connection metals disposed on a lower side of the first printed circuit board; a second printed circuit board disposed on an upper side of the first printed circuit board; second electrical connection metals disposed between the upper side of the first printed circuit board and a lower side of the second printed circuit board, and connecting the first printed circuit board and the second printed circuit board to each other; third electrical connection metals disposed on an upper side of the second printed circuit board; and a reinforcing structure disposed between the first and second printed circuit boards, attached to the lower side of the second printed circuit board, and spaced apart from the first printed circuit board.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below may be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape resulting from manufacturing. The following embodiments may also be constituted by one or a combination thereof.

The contents of the present disclosure described below may have a variety of configurations and propose only a required configuration herein, but are not limited thereto.

Figure 1:
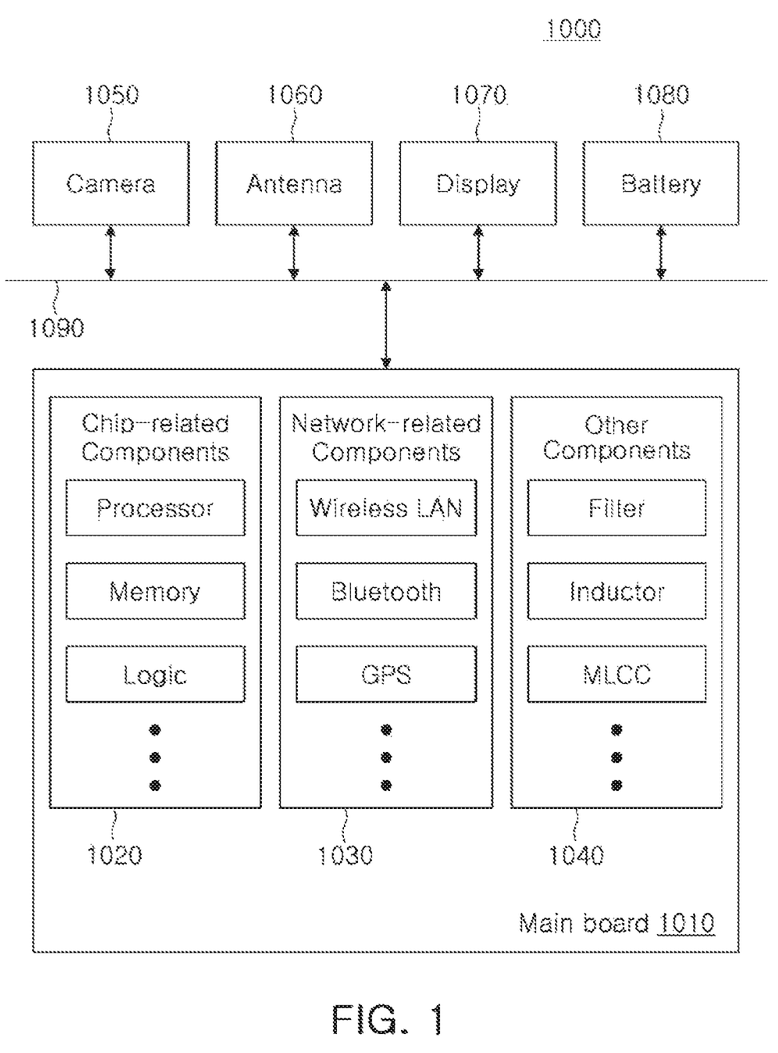
FIG. 1 is a schematic block diagram illustrating an example of an electronic device system.

FIG. 1 is a block diagram schematically illustrating an example of an electronic device system.

Referring to FIG. 1, an electronic device 1000 may accommodate a mainboard 1010 therein. The mainboard 1010 may include chip-related components 1020, network-related components 1030, other components 1040, or the like, physically or electrically connected thereto. These electronic components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip-related components 1020 are not limited thereto, and may include other types of chip-related electronic components. In addition, the chip-related components 1020 may be combined with each other. The chip-related components 1020 may have a package form including the above-mentioned chip or electronic component.

The network-related components 1030 may include protocols such as wireless fidelity (Wi-Fi) (institute of electrical and electronics engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-mentioned protocols. However, the network-related components 1030 are not limited thereto, but may also include a variety of other wireless or wired standards or protocols. In addition, the network-related components 1030 may be combined with each other, together with the chip-related electronic components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components in the form of a chip component used for various other purposes, or the like. In addition, other components 1040 may be combined with each other, together with the chip-related electronic components 1020 or the network-related electronic components 1030 described above.

Depending on a type of the electronic device 1000, the electronic device 1000 includes other electronic components that may or may not be physically or electrically connected to the mainboard 1010. As an example of other electronic components, a camera module 1050, an antenna module 1060, a display 1070, a battery 1080, and the like may be provided. However, the other electronic components are not limited thereto, and may be an audio codec, a video codec, a power amplifier, a compass, an accelerometer, a gyroscope, a speaker, a mass storage device (for example, a hard disk drive), a compact disk (CD), a digital versatile disk (DVD), or the like. In addition, the other electronic components, used for various purposes, may be included according to the type of the electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
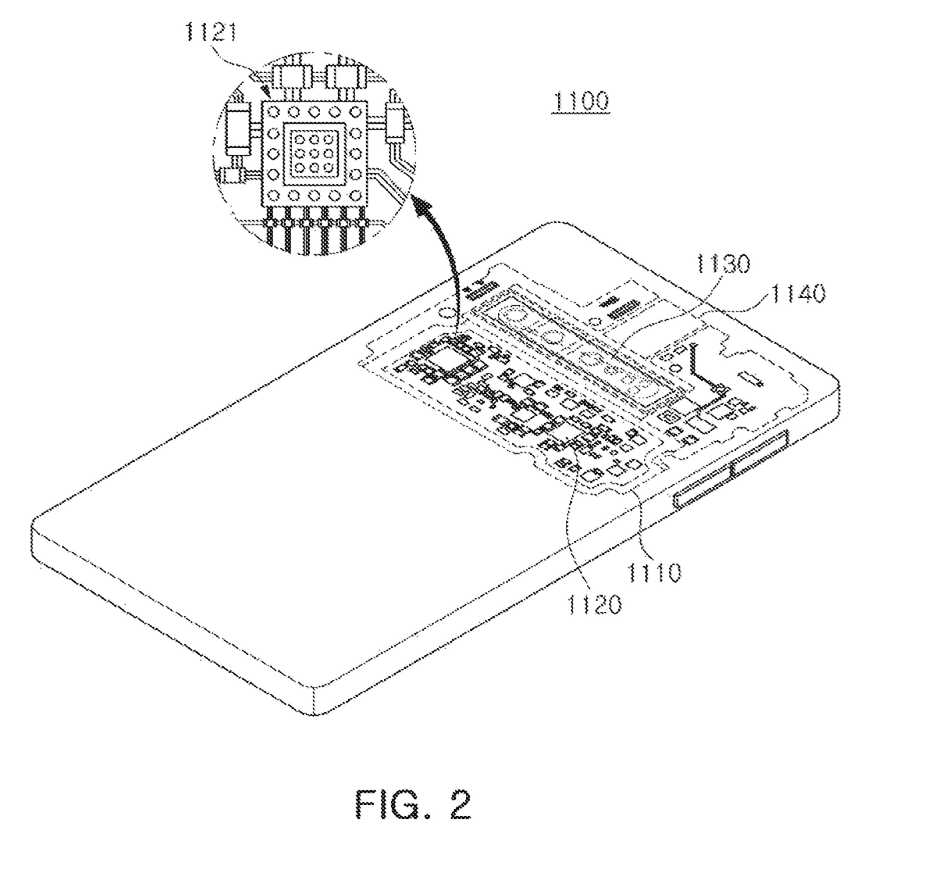
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A mainboard 1110 may be accommodated in a smartphone 1100, and various electronic components 1120 may be physically or electrically connected to the mainboard 1110. In addition, other components that may or may not be physically or electrically connected to the mainboard 1110, such as a camera module 1130 and/or a speaker 1140, may be accommodated therein. Some of the electronic components 1120 may be the chip-related components described above, for example, a semiconductor package 1121, but are not limited thereto. The semiconductor package 1121 may be a package substrate in the form of a multilayer printed circuit board or may have a form in which a semiconductor chip or passive component is mounted on a surface of a substrate-on-substrate structure including the same, but is not limited thereto. On the other hand, the electronic device is not necessarily limited to the smartphone 1100, but may be other electronic devices as described above.

Figure 3:
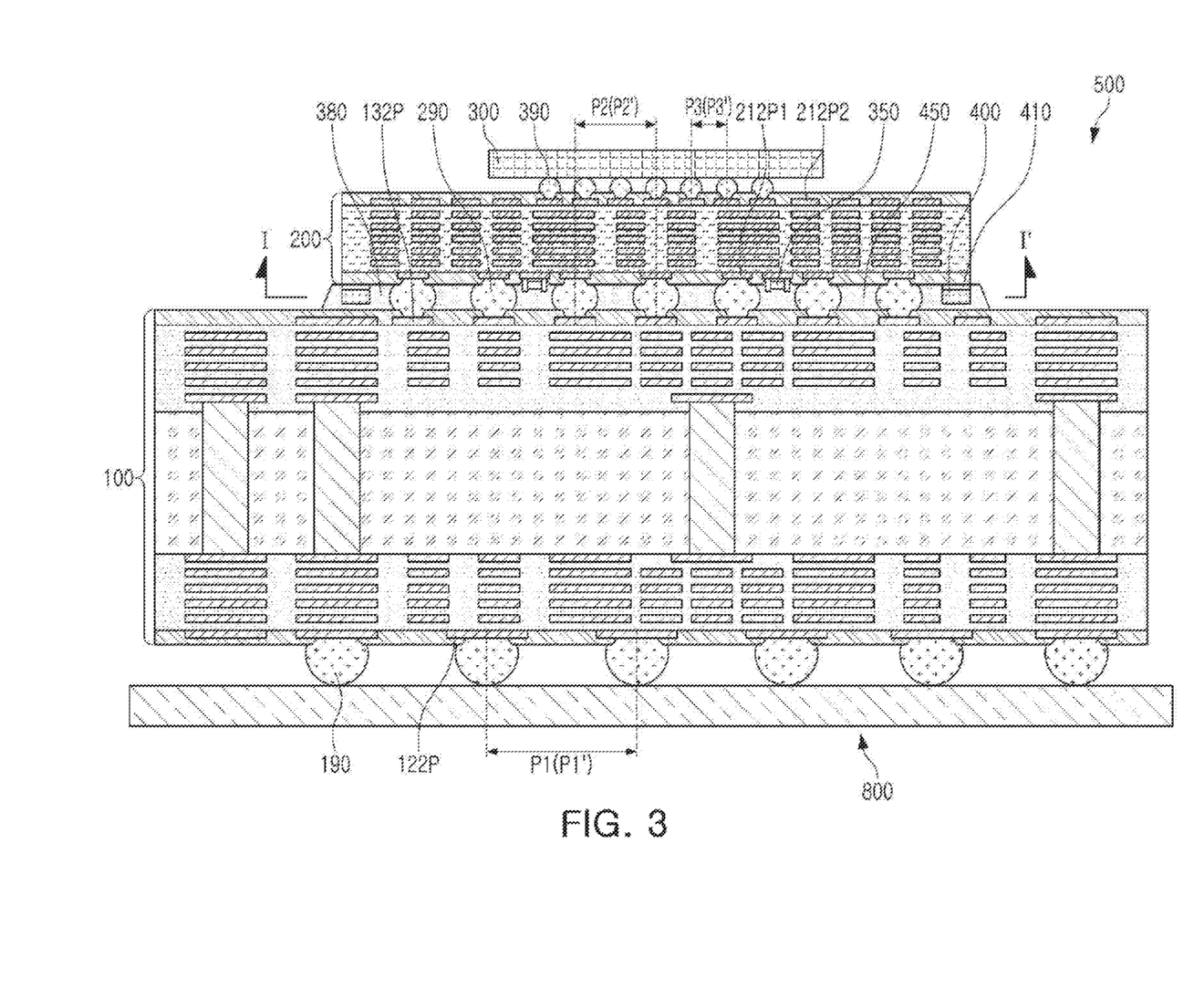
FIG. 3 is a schematic cross-sectional view illustrating an example of a substrate-on-substrate structure.

FIG. 3 is a schematic cross-sectional view illustrating an example of a substrate-on-substrate structure.

Figure 4:
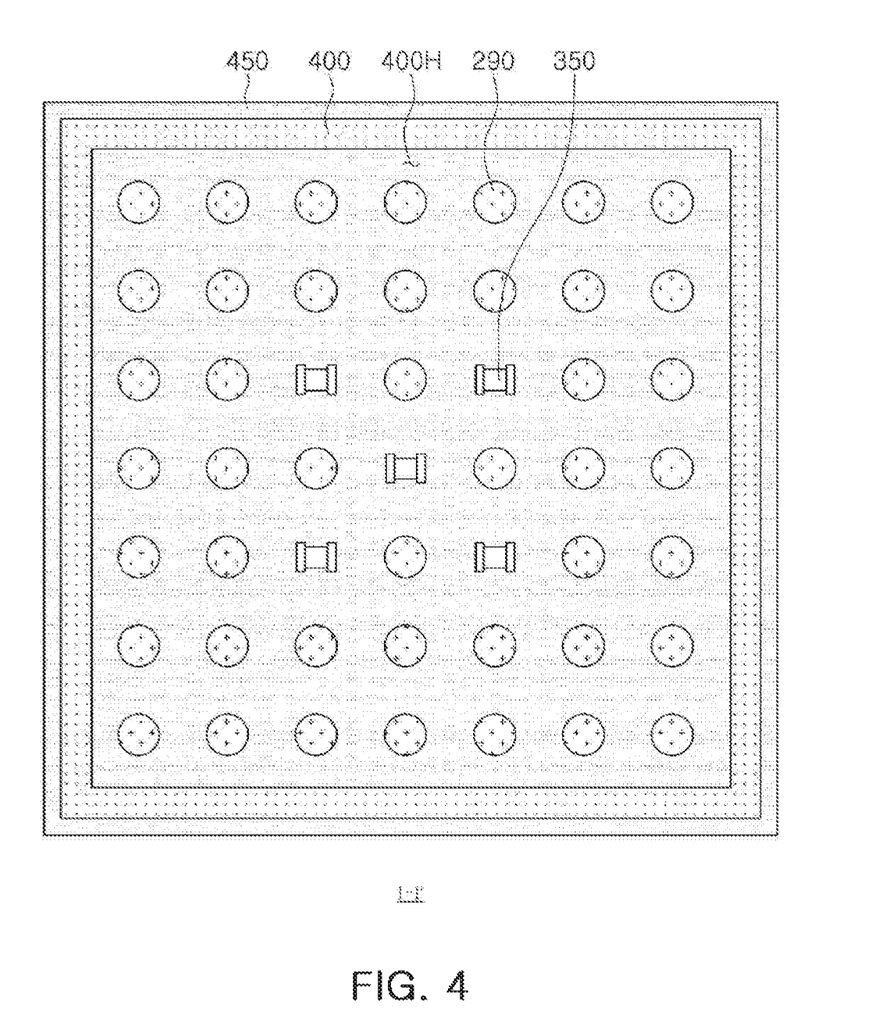
FIG. 4 is a schematic plan view taken along line I-I' of the substrate-on-substrate structure of FIG. 3.

FIG. 4 is a schematic plan view taken along line I-I' of the substrate-on-substrate structure of FIG. 3.

Referring to the drawings, a substrate-to-substrate structure according to an embodiment includes a first printed circuit board 100, a second printed circuit board 200 disposed on the first printed circuit board 100, a reinforcing structure 400 attached to a lower side of the second printed circuit board 200 and spaced apart from an upper side of the first printed circuit board 100, and an underfill resin 450 disposed between the first and second printed circuit boards 100 and 200 and covering at least a portion of the reinforcing structure 400. The reinforcing structure 400 is provided for warpage control, and may be a stiffener, but is not limited thereto.

As described above, the substrate-on-substrate structure 500 according to an embodiment may have a stacked structure of the first and second printed circuit boards 100 and 200 corresponding to high degrees of layering and a large size. Thus, as compared with the case in which a substrate having high degrees of layering and a large size is manufactured through simply one printed circuit board, difficulty of the technology may be reduced, yield may be increased, and as a result, costs may be reduced. In addition, the wiring designs of the first printed circuit board 100 and the second printed circuit board 200 are different from each other, the optimal wiring design may be achieved, and as a result, more excellent performance may be provided.

Moreover, in the substrate-on-substrate structure 500 according to an embodiment, the reinforcing structure 400 is disposed between the first and second printed circuit boards 100 and 200, and thus warpage characteristics may be effectively improved. The reinforcing structure 400 may be introduced while being attached to a lower side of the second printed circuit board 200, and may be spaced apart from the first printed circuit board 100. In this case, while the reinforcing structure 400 is attached to the second printed circuit board 200 in advance, an assembly process of the first and second printed circuit boards 100 and 200 may be performed. In this regard, the reinforcing structure 400 may be easily introduced into the substrate-on-substrate structure 500 according to an example without a problem such as an alignment defect.

Moreover, in the substrate-on-substrate structure 500 according to an embodiment, the underfill resin 450 covers at least a portion of the reinforcing structure 400. In this regard, the reinforcing structure 400 may be stably fixed. In an embodiment, the underfill resin 450 fills at least a portion of a space between the first printed circuit board 100 and the reinforcing structure 400. In this case, the underfill resin 450 covers the reinforcing structure 400 in the form of surrounding side surfaces and a lower surface of the reinforcing structure 400. In this regard, the reinforcing structure 400 may be more effectively and stably fixed. The underfill resin 450 may also cover at least a portion of each of a plurality of second electrical connection metals 290 and/or the passive component 350 to be described later, and also fix the same. The underfill resin 450 may include a thermosetting resin such as an epoxy resin, but is not limited thereto. Alternatively, other materials may also be used for the underfill resin, as long as the underfill resin is disposed between the first and second printed circuit boards 100 and 200 to embed and fix the reinforcing structure 400, the plurality of second electrical connection metals 290, and/or the passive components 350.

An electronic component 300 may be provided on an upper side of the second printed circuit board 200. For example, the substrate-on-substrate structure 500 according to an embodiment may function as a package substrate. The electronic component 300 may be a known active and/or passive component. The electronic component 300 may be a semiconductor chip, for example, a memory chip such as a volatile memory, a non-volatile memory, a flash memory, or the like, an application processor chip such as a central processor, a graphics processor, a digital signal processor, a cryptographic processor, a microprocessor, a microcontroller, or the like, or a logic chip such as an analog to digital converter, ASIC, or the like. However, an embodiment of the present disclosure is not limited thereto. The electronic component 300 may be arranged in a package form as necessary. Moreover, the electronic component 300 may be provided as a plurality of electronic components, and the respective electronic components may be the same type or different types.

A passive component 350 may be surface mounted below the second printed circuit board 200. The passive component 350 may be electrically connected to the electronic component 300 through internal wiring of the second printed circuit board 200. The passive component 350 may be a chip type known inductor or capacitor, which may be surface mounted. Through the arrangement of the passive component 350, electrical characteristics of the electronic component 300, for example, power integrity (PI) may be improved.

The first printed circuit board 100 may be mounted on a mainboard 800 through a plurality of first electrical connection metals 190 having a first pitch P1. In addition, the second printed circuit board 200 may be mounted on the first printed circuit board 100 through a plurality of second electrical connection metals 290 having a second pitch P2. Moreover, the electronic component 300 may be mounted on the second printed circuit board 200 through a third electrical connection metal 390 having a third pitch P3. The first pitch P1 may be greater than the second pitch P2, and the second pitch P2 may be greater than the third pitch P3. As described above, the substrate-on-substrate structure 500 according to an embodiment may be mounted on a mainboard 800 of an electronic device such as a smartphone, described above. In this case, the first printed circuit board 100 may have a larger scale than the second printed circuit board 200, while the second printed circuit board 200 may have a larger scale than the electronic component 300. For example, the first printed circuit board 100 may have a greater thickness than the second printed circuit board 200. In addition, the first printed circuit board 100 may have a wider planar area than the second printed circuit board 200.

The first printed circuit board 100 may include a plurality of first pads 122P having a first pitch P1' therebelow. In addition, the second printed circuit board 200 may include a plurality of first pads 212P1 having a second pitch P2' therebelow. Moreover, the second printed circuit board 200 may include a plurality of second pads 212P2 having a third pitch P3' thereabove. Meanwhile, the first printed circuit board 100 may include a plurality of second pads 132P thereabove, and the plurality of second pads 132P may have the same pitch as the second pitch P2', but is not limited thereto, and there may be a factory error due to alignment or the like. The plurality of first pads 122P of the first printed circuit board 100 may be connected to a plurality of first electrical connection metals 190, respectively. Each of a plurality of second pads 132P of the first printed circuit board 100 and a plurality of first pads 212P1 of the second printed circuit board 200 may be connected to the second electrical connection metal 290. Each of the plurality of second pads 212P2 of the second printed circuit board 200 may be connected to a third electrical connection metals 390. Thus, the first pitch P1' may be greater than the second pitch P2', and the second pitch P2' may be greater than the third pitch P3'. The first pitch P1 and the first pitch P1' are the same as each other, but there may be a process error due to alignment. This may be the same in the relationship between the second pitch P2 and the second pitch P2', and the relationship between the third pitch P3 and the third pitch P3'.

The reinforcing structure 400 may be disposed to continuously surround the plurality of second electrical connection metals 290 and/or the passive component 350 along an edge of a lower side of the second printed circuit board 200 in the lower side of the second printed circuit board 200. For example, the reinforcing structure 400 may have a through portion 400H, and the plurality of second electrical connection metals 290 and/or the passive component 350 may be disposed in the through portion 400H. Through this arrangement, while the influence on the arrangement of the plurality of second electrical connection metals 290 and/or the passive component 350, a size of the reinforcing structure 400 may be sufficiently ensured. Meanwhile, if necessary, empty spaces for dividing the reinforcing structure 400 into a plurality of units may also be formed in the intervals of the reinforcing structure 400, and in this case, the through portion 400H may be connected to each of the empty spaces.

The reinforcing structure 400 may include a metal and/or ceramic material as a material. In this case, excellent rigidity maintenance and minimization of the difference in thermal expansion coefficients may be effective in warpage control. Moreover, in the case of a metal and/or ceramic-based material, since the thermal conductivity is excellent as compared with a molding resin or insulating resin according to the related art, the heat dissipation characteristics may also be improved. In addition, a process of formation of the through portion 400H may be performed using an etching process rather than a laser drilling process, and thus a foreign material defect may be fundamentally removed. As a metal-based material, an alloy having excellent rigidity and thermal conductivity may be used in addition to a general metallic material such as copper (Cu) and aluminum (Al). In this case, an alloy at least containing iron may be used. For example, an Fe—Ni-based alloy, Invar or Kovar, may be used, but is not limited thereto. In addition, in the case of using a ceramic-based material such as a zirconia-based ($ZrO_2$), alumina ($Al_2O_3$)-based, silicon carbide-based (SiC), silicon nitride-based ($Si_3N_4$) material, or the like, rather than an alloy, a similar effect may be provided. If necessary, a material may be an insulating material. For example, a material of the reinforcing structure 400 may be a thermosetting resin such as an epoxy resin, a thermoplastic resin such as a polyimide resin, or a resin in which the resin is impregnated, together with an inorganic filler in a core material such as a glass fiber, for example, a prepreg. The reinforcing structure 400 may have more excellent rigidity as compared with an insulation material of a build-up layer of the second printed circuit board 200, and may have a greater elastic modulus, by way of example.

The reinforcing structure 400 may be attached to a lower side of the second printed circuit board 200 through an adhesive 410. The adhesive 410 may be, for example, an epoxy resin-based adhesive, a silicone resin-based adhesive, or the like, but are not limited thereto. Alternatively, adhesives, formed of various materials, may be used, as long as the adhesives may attach the reinforcing structure 400 to the second printed circuit board 200 to be fixed.

Figure 5:
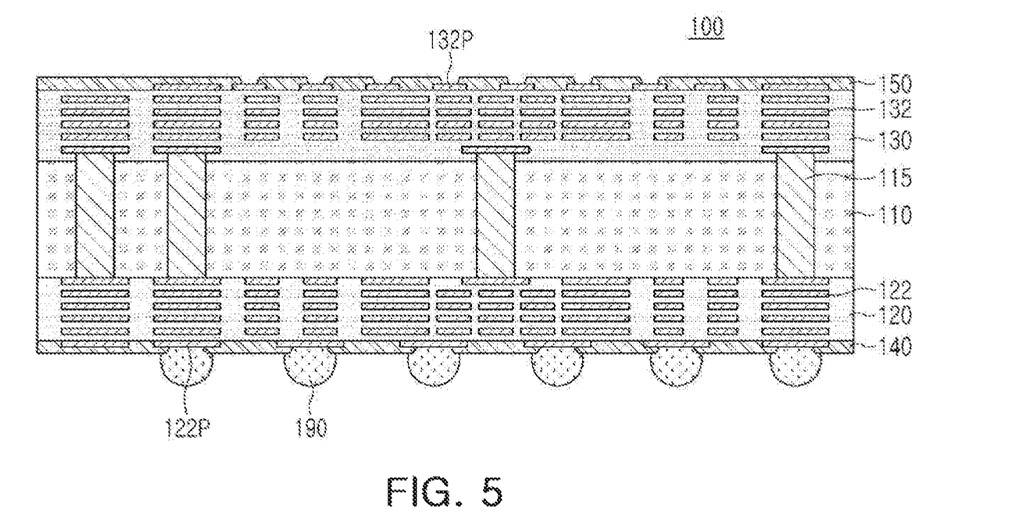
FIG. 5 is a schematic cross-sectional view illustrating an example of a first printed circuit board of FIG. 3.

FIG. 5 is a schematic cross-sectional view illustrating an example of a first printed circuit board of FIG. 3.

Referring to FIG. 5, a first printed circuit board 100 according to an embodiment may be a core type printed circuit board (a cored PCB). For example, the first printed circuit board 100 according to an embodiment includes a core layer 110, a first build-up layer 120 disposed below the core layer 110, a second build-up layer 130 disposed above the core layer, a plurality of first wiring layers 122 embedded in the first build-up layer 120, a plurality of second wiring layers 132 embedded in the second build-up layer 130, and a through via 115 electrically connecting the plurality of first and second wiring layers 122 and 132 while passing through the core layer 110. Layers, vertically adjacent to each other, of each of the plurality of first and second wiring layers 122 and 132 may be electrically connected to each other through vias consisting of a plurality of layers passing through the first and second build-up layers 120 and 130. The first passivation layer 140 may be disposed on the first build-up layer 120. The second passivation layer 150 may be disposed on the second build-up layer 130. The first passivation layer 140 may have a plurality of first openings exposing first pads 122P, respectively, and first electrical connection metals 190 are disposed on the first openings to be connected to the first pads 122P, respectively. The second passivation layer 150 may have a plurality of second openings exposing second pads 132P, respectively, and second electrical connection metals 290, to be described later, are disposed on the second openings to be connected to the second pads 132P, respectively. Meanwhile, the first printed circuit board 100 according to an embodiment does not necessarily have to be a core type, but may also be a coreless type.

The core layer 110 may be a cover board, the center of the first printed circuit board 100 according to an embodiment. For example, an insulating material may be used as the material of the core layer 110. In this case, the insulating material may be a thermosetting resin such as an epoxy resin, a thermoplastic resin such as a polyimide resin, or a material including a reinforcing material such as a glass fiber, a glass cloth, a glass fabric, and/or an inorganic filler, for example, copper clad laminate (CCL), or unclad CCL, or the like. However, it is not limited thereto, and, if necessary, the core layer 110 may be a metal plate or a glass plate, and may be a ceramic plate. If necessary, a material of the core layer 110 may be a liquid crystal polymer (LCP). The core layer 110 may be thicker than a thickness of each insulating layer, forming the build-up layers 120 and 130, for the purpose of warpage control. Moreover, the core layer 110 may have more excellent rigidity as compared with each insulating layer, forming the build-up layers 120 and 130, for the purpose of warpage control. For example, the core layer 110 may have an elastic modulus greater than each insulating layer.

The build-up layers 120 and 130 may provide an insulating region for formation of a multilayer wiring on both sides based on the core layer 110. Each of the build-up layers 120 and 130 may include a plurality of insulating layers, and boundaries between the insulating layers may be clear or unclear. The material of the insulating layers may be an insulating material. In this case, each insulating material may be a thermosetting resin such as an epoxy resin, a thermoplastic resin such as a polyimide resin, or a material including a reinforcing material such as a glass fiber and/or an inorganic filler with the same, for example, prepreg, an Ajinomoto Build-up Film (ABF), or the like. If necessary, a material of the insulating layer may be a Photoimageable Dielectric (PID) material. Meanwhile, the insulating layer may include the same material, or may include different materials.

A material of the wiring layers 122 and 132 may also be a metallic material such as copper (Cu), aluminum (Al), silver (Ag), tin (Sn), gold (Au), nickel (Ni), lead (Pb), titanium (Ti), or alloys thereof. The wiring layers 122 and 132 may be formed using a plating process, for example, an Additive Process (AP), a Semi AP (SAP), a Modified SAP (MSAP), Tenting (TT), or the like, and as a result, each wiring layer may include a seed layer, an electroless plating layer, and an electrolytic plating layer, formed based on the seed layer. The wiring layers 122 and 132 may perform various functions depending on designs of their corresponding layers. For example, the wiring layer may include a ground pattern, a power pattern, a signal pattern, or the like. Here, the signal pattern may include various signals except for a ground pattern, a power pattern, or the like, and may include, for example, a data signal, or the like. Each pattern may include a line pattern, a plane pattern, and/or a pad pattern. A material of a via connected to the wiring layers 122 and 132 may be a metallic material, and the via is also formed using a plating process such as AP, SAP, MSAP, TT, or the like. The via may also perform various functions depending on a design of the corresponding layer. For example, the via may include a wiring via for signal connection, a wiring via for ground connection, a wiring via for power connection, or the like. Each via may be completely filled with a metallic material, or the metallic material may be formed along a wall of a via hole. Moreover, all of the shapes known in the related art, such as a tapered shape, or the like, may be applied thereto.

The through via 115 may connect wiring layers 122 and 132, disposed below and above the core layer 110, respectively, to each other while passing through the core layer 110. A material of the through via 115 may also be a metallic material such as copper (Cu), aluminum (Al), silver (Ag), tin (Sn), gold (Au), nickel (Ni), lead (Pb), titanium (Ti), or alloys thereof. Each through via 115 may also be formed using a plating process such as AP, SAP, MSAP, TT, or the like, and as a result, each through via layer may include a seed layer, an electroless plating layer, and an electrolytic plating layer formed based on the seed layer. The through via 115 may include a through-via for signal connection, a through-via for ground connection, a through-via for power connection, or the like. The through via 115 may have a cylindrical shape, an hourglass shape, or the like. If necessary, an insulating material may be filled in the through via 115.

The passivation layers 140 and 150 are additional components which can protect an internal configuration of the first printed circuit board 100 according to an embodiment from external physical and chemical damage. Each of the passivation layers 140 and 150 may include a thermosetting resin. For example, each of the passivation layers 140 and 150 may be an Ajinomoto buildup film (ABF). However, it is not limited thereto, and each of the passivation layers 140 and 150 may be a known Solder Resist (SR) layer. Moreover, if necessary, the PID may be included therein. Each of the passivation layers 140 and 150 may include a plurality of openings. Meanwhile, through the plurality of openings, a surface treatment layer may be formed on a surface of the exposed pads 122P and 132P. The surface treatment layer may be formed using, for example, electrolytic gold plating, electroless gold plating, Organic Solderability Preservative (OSP) or electroless tin plating, electroless silver plating, electroless nickel plating/replacement plating, Direct Immersion Gold (DIG) plating, Hot Air Solder Leveling (HASL), or the like. If necessary, each opening may be formed of a plurality of via holes. If necessary, an under bump metal (UBM) may be disposed on each opening to improve reliability.

The electrical connection metal 190 is an additional component which can physically and/or electrically connect the first printed circuit board 100 according to an embodiment to an outside. For example, the first printed circuit board 100 according to an embodiment may be mounted on another substrate such as a mainboard of an electronic device through the electrical connection metal 190. For example, the first printed circuit board 100 according to an embodiment may be a portion or the entirety of a Ball Grid Array (BGA) type package. Respective electrical connection metals 190 may be disposed on a plurality of openings of the passivation layers 140 and 150. Each of the electrical connection metals 190 may be formed of a low melting point metal as compared with copper (Cu), for example, tin (Sn) or an alloy including tin (Sn). For example, each of the electrical connection metals 190 may be formed of a solder, but it is only an example and a material therefor is not limited thereto.

Each of the electrical connection metals 190 may be a land, a ball, a pin, or the like. The electrical connection metals 190 may be formed as a multilayer or single layer structure. When the electrical connection metal includes the plurality of layers, the electrical connection metal includes a copper pillar and a solder. When the electrical connection metal includes the single layer, the electrical connection metal includes a tin-silver solder. However, the electrical connection metal is only an example, and the present disclosure is not limited thereto. The number, an interval, a disposition form, and the like, of the electrical connection metals 190 are not particularly limited, but may be sufficiently modified depending on design particulars by those skilled in the art.

Figure 6:
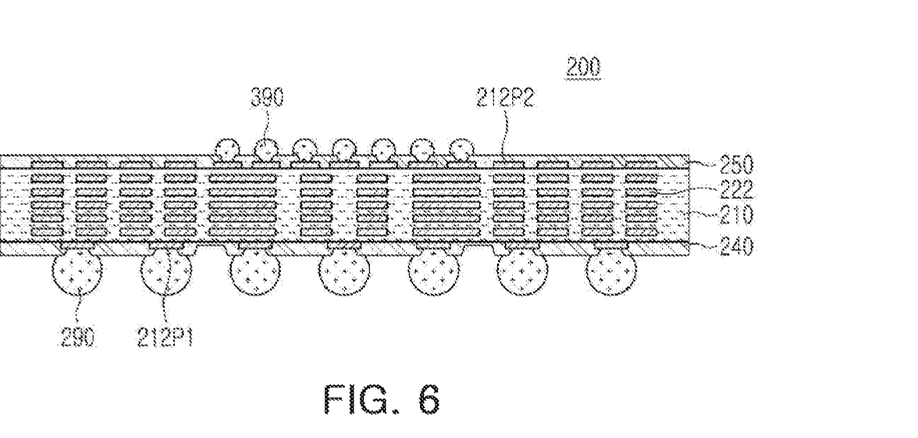
FIG. 6 is a schematic cross-sectional view illustrating an example of a second printed circuit board of FIG. 3.

FIG. 6 is a schematic cross-sectional view illustrating an example of a second printed circuit board of FIG. 3.

Referring to FIG. 6, a second printed circuit board 200 according to an embodiment may be a coreless type printed circuit board (a coreless PCB). For example, the second printed circuit board 200 according to an embodiment includes a build-up layer 210, and a plurality of wiring layers 222 embedded in the build-up layer 210. Layers, vertically adjacent to each other, of each of the plurality of wiring layers 222 may be electrically connected to each other through vias consisting of a plurality of layers passing through the build-up layers 210. A first passivation layer 240 may be disposed below the build-up layer 210. A second passivation layer 250 may be disposed above the build-up layer 210. The first passivation layer 240 may have a plurality of first openings exposing first pads 212P1, respectively, and second electrical connection metals 290 are disposed on the first openings to be connected to the first pads 212P1, respectively. The second passivation layer 250 may have a plurality of second openings exposing second pads 212P2, respectively, and third electrical connection metals 390 are disposed on the second openings to be connected to the second pads 212P2, respectively. Meanwhile, the second printed circuit board 200 according to an embodiment does not necessarily have to be a coreless type, but may also be a core type.

The build-up layer 210 may provide an insulating region for formation of a multilayer wiring. The build-up layer 210 may include a plurality of insulating layers, and boundaries between the insulating layers may be clear or unclear. The material of the insulating layers may be an insulating material. In this case, each insulating material may be a thermosetting resin such as an epoxy resin, a thermoplastic resin such as a polyimide resin, or a material including a reinforcing material such as a glass fiber and/or an inorganic filler with the same, for example, prepreg, an ABF, or the like. If necessary, a material of the insulating layer may be PID. Meanwhile, the insulating layer may include the same material, or may include different materials.

A material of the wiring layer 222 may be a metallic material, and, in this case, the metallic material may be copper (Cu), aluminum (Al), silver (Ag), tin (Sn), gold (Au), nickel (Ni), lead (Pb), titanium (Ti), or alloys thereof. The core wiring layer 222 may be formed using a plating process, for example, an Additive Process (AP), a Semi AP (SAP), a Modified SAP (MSAP), Tenting (TT), or the like, and as a result, each core wiring layer may include a seed layer, an electroless plating layer, and an electrolytic plating layer, formed based on the seed layer. The wiring layer 222 may perform various functions depending on a design of a corresponding layer. For example, the wiring layer may include a ground pattern, a power pattern, a signal pattern, or the like. Here, the signal pattern may include various signals except for a ground pattern, a power pattern, or the like, and may include, for example, a data signal, or the like. Each pattern may include a line pattern, a plane pattern, and/or a pad pattern. A material of a via connected to the wiring layer 222 may be a metallic material, and the via is also formed using a plating process such as AP, SAP, MSAP, TT, or the like. The via may also perform various functions depending on a design of the corresponding layer. For example, the via may include a wiring via for signal connection, a wiring via for ground connection, a wiring via for power connection, or the like. Each via may be completely filled with a metallic material, or the metallic material may be formed along a wall of a via hole. Moreover, all of the shapes known in the related art, such as a tapered shape, or the like, may be applied thereto.

The passivation layers 240 and 250 are additional components which can protect an internal configuration of the second printed circuit board 200 according to an embodiment from external physical and chemical damage. Each of the passivation layers 240 and 250 may include a thermosetting resin. For example, each of the passivation layers 240 and 250 may be an Ajinomoto buildup film (ABF). However, it is not limited thereto, and each of the passivation layers 240 and 250 may be a known SR layer. Moreover, if necessary, the PID may be included therein. Each of the passivation layers 240 and 250 may include a plurality of openings. Meanwhile, through the plurality of openings, a surface treatment layer may be formed on a surface of the exposed pads 222P1 and 222P2. The surface treatment layer may be formed by, for example, electrolytic gold plating, electroless gold plating, OSP or electroless tin plating, electroless silver plating, electroless nickel plating/substituted gold plating, DIG plating, HASL, or the like. If necessary, each opening may be formed of a plurality of via holes. If necessary, an UBM may be disposed on each opening to improve reliability.

The electrical connection metals 290 and 390 are additional components which can physically and/or electrically connect the second printed circuit board 200 according to an embodiment to an outside. For example, the second printed circuit board 200 according to an embodiment may be mounted on another printed circuit board through the second electrical connection metal 290. Moreover, an electronic component may be mounted on the second printed circuit board 200 according to an embodiment through the third electrical connection metal 390. For example, the second printed circuit board 200 according to an embodiment may be a portion or the entirety of a BGA type package. Respective electrical connection metals 290 and 390 may be disposed on a plurality of openings of the passivation layers 240 and 250. Each of the electrical connection metals 290 and 390 may be formed of a low melting point metal as compared with copper (Cu), for example, tin (Sn) or an alloy including tin (Sn). For example, each of the electrical connection metals 290 and 390 may be formed of a solder, but it is only an example and a material therefor is not limited thereto.

Each of the electrical connection metals 290 and 390 may be a land, a ball, a pin, or the like. The electrical connection metals 290 and 390 may be formed as a multilayer or single layer structure. When the electrical connection metal includes the plurality of layers, the electrical connection metal includes a copper pillar and a solder. When the electrical connection metal includes the single layer, the electrical connection metal includes a tin-silver solder. However, the electrical connection metal is only an example, and the present disclosure is not limited thereto. The number, an interval, a disposition form, and the like, of the electrical connection metals 290 and 390 are not particularly limited, but may be sufficiently modified depending on design particulars by those skilled in the art.

As set forth above, according to example embodiments of the present inventive concept, a substrate-on-substrate structure capable of coping with high degrees of layering and a large size of a substrate, and an electronic device including the same may be provided.

In addition, a substrate-on-substrate structure capable of reducing costs, and an electronic device including the same may be provided.

Moreover, a substrate-on-substrate structure capable of easily improving warpage characteristics, and an electronic device including the same may be provided.

While example embodiments have been shown and described above, it will be apparent to those skilled in the art that modifications and variations could be made without departing from the scope of the present disclosure, as defined by the appended claims.

What is claimed is:

1. A substrate-on-substrate structure, comprising:
   a first printed circuit board having a first side and a second side, opposite to the first side;
   a second printed circuit board disposed on the second side of the first printed circuit board, the second printed circuit board having a first side connected to the second side of the first printed circuit board, and the second printed circuit board having a second side opposite to the first side of the second printed circuit board;
   a reinforcing structure attached to the first side of the second printed circuit board, and spaced apart from the second side of the first printed circuit board; and
   an underfill resin disposed between the second side of the first printed circuit board and the first side of the second printed circuit board, and covering at least a portion of the reinforcing structure,
   wherein the underfill resin is disposed in at least a portion between the second side of the first printed circuit board and the reinforcing structure.

2. The substrate-on-substrate structure of claim 1, further comprising:
   a plurality of electrical connection metals disposed between the second side of the first printed circuit board and the first side of the second printed circuit board, and connecting the second side of the first printed circuit board to the first side of the second printed circuit board,
   wherein the underfill resin covers at least a portion of each of the plurality of electrical connection metals.

3. The substrate-on-substrate structure of claim 2, further comprising:
   a passive component mounted on the first side of the second printed circuit board,
   wherein the underfill resin covers at least portion of the passive component.

4. The substrate-on-substrate structure of claim 3, wherein the reinforcing structure has a through portion, and
   the plurality of electrical connection metals and the passive component are disposed in the through portion.

5. The substrate-on-substrate structure of claim 1, wherein the reinforcing structure is continuously disposed along an edge of the first side of the second printed circuit board.

6. The substrate-on-substrate structure of claim 1, wherein the reinforcing structure is attached to the first side of the second printed circuit board through an adhesive.

7. The substrate-on-substrate structure of claim 1, wherein the first printed circuit board is a core type printed circuit board, and
   the second printed circuit board is a coreless type printed circuit board.

8. The substrate-on-substrate structure of claim 7, wherein the first printed circuit board is thicker than the second printed circuit board.

9. The substrate-on-substrate structure of claim 7, wherein a planar area of the first printed circuit board is greater than that of the second printed circuit board.

10. The substrate-on-substrate structure of claim 1, wherein the first printed circuit board includes first pads having a first pitch in the first side of the first printed circuit board,
   the second printed circuit board includes second pads having a second pitch in the first side of the second printed circuit board, and
   the first pitch is greater than the second pitch.

11. The substrate-on-substrate structure of claim 10, wherein the second printed circuit board further includes third pads having a third pitch in the second side of the second printed circuit board, and
   the second pitch is greater than the third pitch.

12. An electronic device, comprising:
   a mainboard;
   a first printed circuit board disposed on an upper side of the mainboard;
   a second printed circuit board disposed on an upper side of the first printed circuit board;
   an electronic component disposed on an upper side of the second printed circuit board;
   a reinforcing structure disposed between the first and second printed circuit boards, attached to a lower side of the second printed circuit board, and spaced apart from the first printed circuit board; and
   an underfill resin disposed between the first and second printed circuit boards, and covering at least a portion of the reinforcing structure,
   wherein the underfill resin is disposed between the first printed circuit board and the reinforcing structure.

13. The electronic device of claim 12, wherein the first printed circuit board is mounted on the mainboard through a plurality of first electrical connection metals having a first pitch,
   the second printed circuit board is mounted on the first printed circuit board through a plurality of second electrical connection metals having a second pitch,
   the electronic component is mounted on the second printed circuit board through a plurality of third electrical connection metals having a third pitch,
   the first pitch is greater than the second pitch, and
   the second pitch is greater than the third pitch.

14. A substrate-on-substrate structure, comprising:
   a mainboard;
   a first printed circuit board;
   first electrical connection metals disposed on a lower side of the first printed circuit board;
   a second printed circuit board disposed on an upper side of the first printed circuit board;
   second electrical connection metals disposed between the upper side of the first printed circuit board and a lower side of the second printed circuit board, and connecting the first printed circuit board and the second printed circuit board to each other;
   third electrical connection metals disposed on an upper side of the second printed circuit board; and
   a reinforcing structure disposed between the first and second printed circuit boards, attached to the lower side of the second printed circuit board, and spaced apart from the first printed circuit board,
   wherein the first printed circuit board is mounted on the mainboard through the first electrical connection metals.

15. The substrate-on-substrate structure of claim 14, further comprising:
   an underfill resin disposed between the first and second printed circuit boards, and covering at least a portion of the reinforcing structure.

16. The substrate-on-substrate structure of claim 14, wherein the reinforcing structure is composed of a metal or a ceramic.

17. The substrate-on-substrate structure of claim 14, wherein an elastic modulus of the reinforcing structure is greater than each of an elastic modulus of a build-up layer of the first printed circuit board and an elastic modulus of a build-up layer of the second printed circuit board.

18. The substrate-on-substrate structure of claim 14, wherein the reinforcing structure has a through hole, in which each of the second electrical connection metals is disposed.

* * * * *